(12) United States Patent
Matsumoto et al.

(10) Patent No.: US 9,385,836 B2
(45) Date of Patent: Jul. 5, 2016

(54) WIRELESS RELAY APPARATUS, WIRELESS RECEIVING APPARATUS, AND DECODING METHOD

(71) Applicant: KABUSHIKI KAISHA TOSHIBA, Minato-ku, Tokyo (JP)

(72) Inventors: Tadashi Matsumoto, Nomi (JP); Tsuguhide Aoki, Kawasaki (JP); Yasuhiko Tanabe, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/554,204

(22) Filed: Nov. 26, 2014

(65) Prior Publication Data

US 2015/0082114 A1 Mar. 19, 2015

Related U.S. Application Data

(60) Division of application No. 13/092,603, filed on Apr. 22, 2011, now Pat. No. 8,924,813, which is a continuation of application No. PCT/JP2009/068274, filed on Oct. 23, 2009.

(30) Foreign Application Priority Data

Oct. 24, 2008 (JP) ................................ 2008-274007

(51) Int. Cl.
*H04L 1/00* (2006.01)
*H03M 13/29* (2006.01)
(Continued)

(52) U.S. Cl.
CPC ......... *H04L 1/0045* (2013.01); *H03M 13/2792* (2013.01); *H03M 13/2957* (2013.01); *H04B 7/155* (2013.01); *H04L 1/005* (2013.01); *H04L 2001/0097* (2013.01)

(58) Field of Classification Search
CPC ................. H04L 1/0045; H04L 1/005; H04L 2001/0097; H03M 13/2792; H03M 13/2957; H04B 7/155
USPC .................................................. 714/776, 794
See application file for complete search history.

(56) References Cited

U.S. PATENT DOCUMENTS 4,701,923 A 10/1987 Fukasawa et al.
5,430,738 A 7/1995 Tsuda
(Continued)

FOREIGN PATENT DOCUMENTS

EP 1 670 144 A1 6/2006

OTHER PUBLICATIONS

Battail et al "Suboptimum Decoding Using Kullback Principle" IPMU '88 Proceedings of the 2nd International Conference on Information Processing and Management of Uncertainty in Knowledge-Based Systems: Uncertainty and Intelligent Systems pp. 93-101 1988.*

(Continued)

*Primary Examiner* — Cynthia Britt
(74) *Attorney, Agent, or Firm* — Foley & Lardner LLP

(57) ABSTRACT

In one embodiment, a wireless relay apparatus for replaying a signal processed by first encoding from a transmitting apparatus to a receiving apparatus is disclosed. The apparatus includes a demodulation unit, a decoding unit, a detection unit, an extraction unit, and an encoding unit. The demodulation unit demodulates a received signal. The decoding unit performs error correction decoding corresponding to the first encoding on the demodulated signal. The detection unit detects an error in a decoded signal. The extraction unit extracts a portion pertaining to information data from the demodulated signal by hard decision, if the detection unit detects an error. The encoding unit performs error correcting coding on the extracted portion pertaining to the information data with an error. The information data encoded by the encoding unit is transmitted.

13 Claims, 5 Drawing Sheets

(51) Int. Cl.
 *H04B 7/155* (2006.01)
 *H03M 13/27* (2006.01)

(56) References Cited

U.S. PATENT DOCUMENTS

| | | | |
|---|---|---|---|
| 5,491,772 A | 2/1996 | Hardwick et al. | |
| 5,621,737 A | 4/1997 | Bucher | |
| 5,886,999 A | 3/1999 | Kojima et al. | |
| 6,324,668 B1 | 11/2001 | Classon | |
| 6,728,323 B1 | 4/2004 | Chen et al. | |
| 7,159,168 B2 * | 1/2007 | Whinnett | H04L 1/005 714/755 |
| 7,337,383 B1 * | 2/2008 | von der Embse | H03M 13/3905 714/755 |
| 7,398,454 B2 | 7/2008 | Cai et al. | |
| 7,415,079 B2 * | 8/2008 | Cameron | H03M 13/1102 375/340 |
| 7,787,828 B2 | 8/2010 | Horiguchi et al. | |
| 8,005,051 B2 | 8/2011 | Watanabe | |
| 8,054,904 B2 * | 11/2011 | Hwang | H04B 7/0417 375/148 |
| 8,401,110 B2 * | 3/2013 | Murakami | H04L 1/22 375/262 |
| 8,402,334 B2 | 3/2013 | Yu et al. | |

OTHER PUBLICATIONS

Japanese Office Action (with English translation) dated Dec. 18, 2012 from corresponding JP Patent Application No. 2008-274007; 7 pages.

Li, et al.; "Distributed Turbo Coding with Soft Information Relaying in Multihop Relay Networks"; IEEE Journal on Selected Areas in Communications, IEEE 6th workshop on Signal Processing Advances in Wireless Communications, vol. 24, No. 11, Nov. 2006, pp. 816-820.

Valenti, et al.; "Distributed Turbo Codes: Towards the Capacity of the Relay Channel"; IEEE 58th Vehicular Technology Conference, 2003. VTC 2003-Fall., U.S.A., IEEE, Oct. 6, 2003, vol. 1; pp. 322-326.

Written Opinion dated Jun. 16, 2011 from corresponding PCT/JP2009/068274; 7 pages.

IPRP dated Jun. 16, 2011 from corresponding PCT/JP2009/068274; 9 pages.

Zhao, et al.; "Distributed Turbo Coded Diversity for Relay Channel"; Electronics Letters, May 15, 2003, vol. 39, No. 10, pp. 786-787.

Hoshyar, R., et al., "Soft Decode and Forward of MQAM Modulations for Cooperative Relay Channels"; IEEE Vehicular Technology Conference, 2008, VTC Spring 2008, pp. 639-643.

Xingkai, B., et al.; "Decode-Amplify-Forward (DAF): A New Class of Forwarding Strategy for Wireless Relay Channels"; 2005 IEEE 6th Workshop on Signal Processing Advances in Wireless Communication, 2005, pp. 816-820.

Xingkai, B., et al.; "Efficient Message Relaying for Wireless User Cooperation: Decode-Amplify-Forward (DAF) and Hybrid DAF and Coded-Cooperation,"; IEEE Transactions on Wireless Communications, vol. 6, Issue 11, 2007, pp. 3975-3984.

Fukuyama, Y., et al.; "Relay Method of Sending Soft Decided Symbol Based on the Result of Error Detecting Code in Cooperative Communication"; Faculty of Science and Tech., Keio Univ., Japan, RCS2006-45, 2006, pp. 59-64.

Dabora, R., Servetto, S.D.; "On the Role of Estimate-and-Forward With Time Sharing in Cooperative Communication"; IEEE Transactions on Information Theory, 2008, vol. 54, Issue 10, pp. 4409-4431.

Rabiner, L.R., "A tutorial on Hidden Markov Models and Selected Applications in Speech Recognition"; IEEE, 1989, vol. 77, No. 2, pp. 257-286.

Hunter, T.E., Nosratinia, A., "Cooperation Diversity through Coding"; IEEE, ISTS 2002, p. 220.

International Search Report corresponding to International Patent Application No. PCT/JP2009/06824 dated Dec. 28, 2009.

* cited by examiner

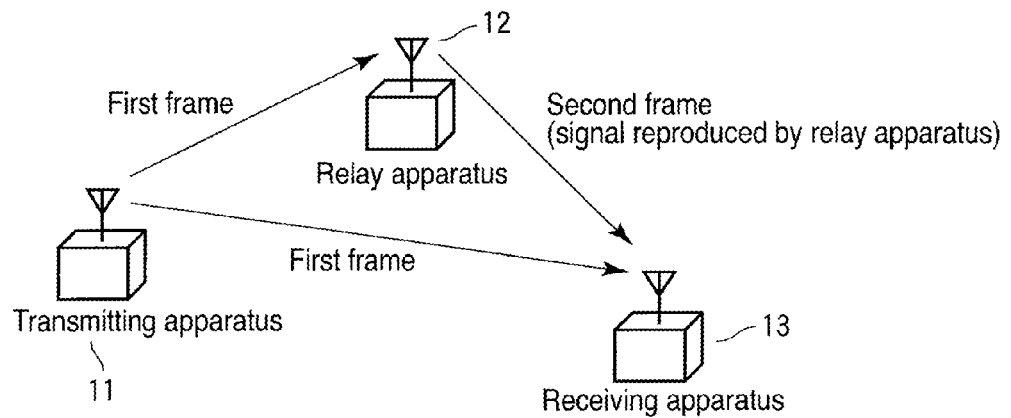
F I G. 1
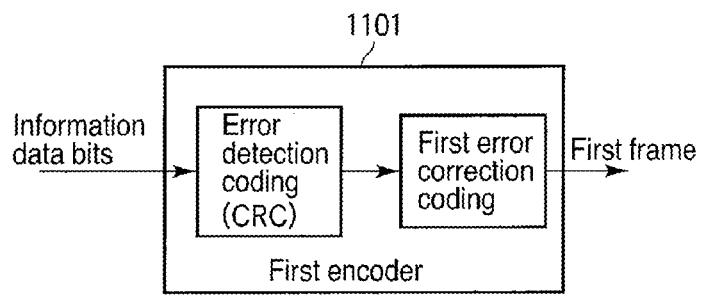
F I G. 2
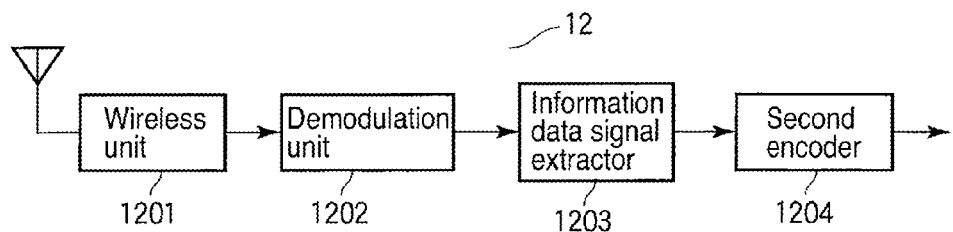
F I G. 3

WIRELESS RELAY APPARATUS, WIRELESS RECEIVING APPARATUS, AND DECODING METHOD

CROSS REFERENCE TO RELATED APPLICATIONS

This application is a divisional of U.S. application Ser. No. 13/092,603 filed on Apr. 22, 2011, now pending which is a Continuation application of PCT Application No. PCT/JP2009/068274, filed Oct. 23, 2009, which was published under PCT Article 21(2) in Japanese. This application is also based upon and claims the benefit of priority from Japanese Patent Application No. 2008-274007, filed Oct. 24, 2008. The entire contents of all of which are incorporated herein by reference.

FIELD

Embodiments described herein relate generally to a wireless communication apparatus and wireless communication system and, more particularly, to a wireless relay apparatus for use in wireless relay, a wireless receiving apparatus, and a decoding method for use in a wireless relay apparatus.

BACKGROUND

Since the power of an electromagnetic wave generally attenuates in accordance with the propagation distance, the communication quality deteriorates in accordance with the distance from a transmitting apparatus in wireless communication. Also, if a transmitting apparatus or receiving apparatus is hidden behind an obstacle, the electrical power decreases even when the communication distance is small, and the communication quality deteriorates in the same manner as when the communication distance is large.

As a method of preventing the deterioration of the communication quality as described above, a relay apparatus can be deployed between a transmitting apparatus and a receiving apparatus. By relaying wireless signals by deploying the relay apparatus, it is possible to shorten the propagation distance between wireless communication apparatuses, and decrease the probability that the communication quality degrades due to shadowing wherein a communication apparatus is hidden behind an obstacle.

Conventional wireless communication methods can roughly be classified into two types: (1) amplify-and-forward (referred to as the AF method hereinafter); and (2) decode-and-forward (referred to as the DF method hereinafter).

In the AF method, the relay apparatus does not restore transmission data from a received signal, but directly amplifies the received signal and relays the amplified signal to a receiving apparatus.

In the DF method, the relay apparatus restores transmission data from a received signal, and relays the data. Since the transmission data is encoded for error detection, the relay apparatus interrupts relay if it detects an error (occurring in a link between a transmitting apparatus and the relay apparatus). The purpose of this processing is to prevent the relay apparatus from relaying an error signal.

Comparing the AF method with the DF method shows that the DF method can theoretically achieve a higher throughput.

Note that in either method, a diversity gain can be obtained if not only signals can be received via the relay apparatus but also signals transmitted by a transmitting apparatus can directly be received by a receiving apparatus. Note also that in the DF method, a coding gain can reportedly be obtained by applying different coding schemes on the transmitting apparatus and the relay apparatus (e.g., T. E. Hunter and A. Nosratinia, "Cooperation Diversity through coding," IEEE ISIT 2002, Lausanne, Switzerland, p. 220, 2002.).

As described above, if an error occurs in the reception of a signal transmitted by a transmitting apparatus in the conventional relay apparatus using the DF method having a high throughput, the relay apparatus does not relay the erroneous received signal but discards it. In the conventional wireless relay system, therefore, the communication efficiency decreases if the relay apparatus does not correctly receive a signal transmitted by a transmitting apparatus and an error occurs.

Also, if the coding rate is set low, a low-order modulation method is allocated, or the transmission power is increased in order to prevent an error in the relay apparatus, the frequency use efficiency decreases, and the communication efficiency decreases.

In addition, demands have arisen for low power consumption and size reduction of the relay apparatus and a receiving apparatus.

As described above, the communication efficiency conventionally decreases if a signal received by the relay apparatus contains an error.

BRIEF DESCRIPTION OF THE DRAWINGS

FIG. 1 is a view showing a configuration example of a wireless relay system according to an embodiment;

FIG. 2 is a view showing a configuration example of the main parts of a transmitting apparatus;

FIG. 3 is a view showing a configuration example of the main components of a relay apparatus;

DETAILED DESCRIPTION

Figure 4:
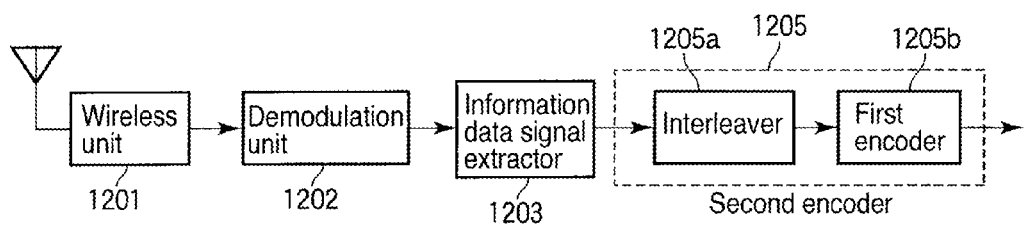
FIG. 4 is a view showing another configuration example of the main components of the relay apparatus.

Embodiments will be explained below with reference to the accompanying drawings.

In one embodiment, a wireless relay apparatus for replaying a signal processed by first encoding from a transmitting apparatus to a receiving apparatus is disclosed. The apparatus includes a demodulation unit, a decoding unit, a detection unit, an extraction unit, and an encoding unit. The demodulation unit demodulates a received signal. The decoding unit performs error correction decoding corresponding to the first encoding on the demodulated signal. The detection unit detects an error in a decoded signal. The extraction unit extracts a portion pertaining to information data from the demodulated signal by hard decision, if the detection unit detects an error. The encoding unit performs error correcting coding on the extracted portion pertaining to the information data with an error. The information data encoded by the encoding unit is transmitted.

The embodiments provide a wireless communication system capable of efficient communication without decreasing the communication efficiency, even when a signal received by a relay apparatus contains an error.

First Embodiment

FIG. 1 is a conceptual view of a wireless relay system according to this embodiment. A transmitting apparatus 11 transmits a first frame in order to transmit data to a receiving apparatus 13.

The transmitting apparatus 11 generates the first frame as shown in FIG. 2. FIG. 2 shows a configuration example of an encoder (a first encoder 1101 in FIG. 2) of the transmitting apparatus 11 for generating the first frame.

As shown in FIG. 2, the first encoder 1101 of the transmitting apparatus 11 performs coding (error detection coding) by which the receiving apparatus 13 can detect any errors of information data bits. An example of this coding is a cyclic redundancy check (CRC) code, but the error detection coding of the embodiment is not limited to the CRC code. It is possible to use any coding method as long as error detection can be performed in reception.

Then, first error correcting coding is performed on the signal after the coding by which error detection is possible. The first error correcting code herein used is an error correcting code generally used in wireless communication, such as an LDPC code or turbo code, and it is unnecessary to use any special code.

Note that in the configuration shown in FIG. 2, encoding for error correction is performed after encoding for error detection is performed, i.e., two-step coding is performed. However, this two-step coding as shown in FIG. 2 need not be performed when using a code such as the LDPC code capable of simultaneously performing error correction and error detection. That is, the first error correcting coding may include the error detection coding in FIG. 2. The first encoder 1101 of the transmitting apparatus 11 can use any code, provided that coding by which error detection can be performed on an error-corrected signal in reception is performed.

The transmitting apparatus 11 modulates the signal encoded by the encoder 1101 as described above, and transmits the modulated signal. In the embodiment, the transmitting apparatus 11 can use any modulation scheme generally used in wireless communication. Examples are the phase-shift keying (PSK) methods such as PBSK and QPSK, and the quadrature amplitude modulation (QAM) schemes such as 16QAM and 64QAM. The embodiment does not limit the modulation scheme at all, and the scope of the embodiment does not include the modulation scheme, so a detailed explanation of the modulation scheme will be omitted. Also, the transmitting apparatus 11 converts the digital signal thus generated into an analog signal, and transmits the analog signal. However, the embodiment does not limit the means for generating an analog signal in the transmitting apparatus 11 at all, and the scope of the embodiment does not include this means, so a detailed explanation of the means will be omitted.

The transmitting apparatus 11 transmits the first frame as described above. Since the quality of a link between the transmitting apparatus 11 and receiving apparatus 13 is not necessarily guaranteed, the receiving apparatus 13 may not correctly receive the first frame due to an error occurring in the link. Although a relay apparatus 12 also receives the first frame, the quality of a link between the transmitting apparatus 11 and relay apparatus 13 is not guaranteed either, so the relay apparatus 12 may receive a frame containing an error.

The relay apparatus 12 decodes the error correction code of the received first frame signal, and decodes the error detection code (referred to as a CRC code hereinafter), thereby detecting an error. In the prior art, if no error is detected in the received first frame when the error detection code is decoded, the relay apparatus 12 transmits a second frame obtained by reproducing the first frame to the receiving apparatus 13. However, if an error is detected in the received first frame, the relay apparatus 12 does not perform the process of transmitting the second frame. That is, if an error is detected in the received first frame, the relay apparatus 12 discards the frame, and does not transmit any second frame. Accordingly, if an error occurs in the first frame in the link between the transmitting apparatus 11 and receiving apparatus 13, the receiving apparatus 13 completely loses a data reproduction means.

In the embodiment, however, even when the relay apparatus 12 detects an error in the received first frame, the relay apparatus 12 does not discard the frame but relays it.

FIG. 3 shows a configuration example of the main parts of the relay apparatus 12 according to this embodiment. In the relay apparatus 12 as shown in FIG. 3, a demodulator 1202 demodulates a signal received via an antenna and a wireless unit 1201, and an information data signal extractor 1203 extracts information data. A second encoder 1204 performs second error correcting coding using a method different from that of the first error correcting coding performed by the first encoder 1101 of the transmitting apparatus 11, on the extracted information data regardless of whether the information data contains an error. As in the transmitting apparatus 11, the data is modulated and transmitted to the receiving apparatus 13 via the antenna.

As described previously, the first frame is a signal encoded for error detection in the transmitting apparatus 11. When using, e.g., the CRC code as an error detection code, the CRC code is added to the data.

In this embodiment, the transmitting apparatus 11 applies a systematic code as the first error correcting code. After encoding is performed using the systematic code, the signal is separated into information data part and parity part. Therefore, the information data can be extracted from the signal demodulated by the demodulator 1202, without using any decoding process in reception. In this step, the error rate of the first frame can easily be estimated from the communication quality between the transmitting apparatus 11 and relay apparatus 12. Since the receiving apparatus 13 uses this error rate, the relay apparatus 12 notifies the receiving apparatus 13 of the communication quality or error rate.

Like the transmitting apparatus 11, the relay apparatus 12 modulates the signal after the second error correcting coding, converts the modulated signal into an analog signal, and then transmits the signal. However, the modulation method and the method of conversion into an analog signal are irrelevant to the scope of the embodiment and are not limited at all, so a detailed explanation of these methods will be omitted.

The second encoder 1204 shown in FIG. 3 applies, to the extracted information data, the second error correcting coding using the method different from that of the first error correcting coding used in the transmitting apparatus 11, but the embodiment is not limited to this.

For example, as shown in FIG. 4, a second encoder 1205 can also be used instead of the second encoder 1204 shown in FIG. 3. As shown in FIG. 4, the second encoder 1205 includes an interleaver 1205a, and a first encoder 1205b equal to the first encoder 1101 of the transmitting apparatus 11 (i.e., the first encoder 1205b performs the first error correcting coding used in the first encoder 1101).

In the second encoder 1205, the interleaver 1205*a* first permutes the index (performs an interleaving process of rearranging data in accordance with a predetermined rule) of the information data extracted by the information data signal extractor 1203, and the first encoder 1205*b* performs the same encoding as the first error correcting coding on the permuted data sequence. The second frame signal obtained by thus performing error correcting coding again is transmitted from the relay apparatus 12 to the receiving apparatus 13 as described above.

Thus, even when the received first frame contains an error, the relay apparatus 12 according to this embodiment generates and transmits the second frame, i.e., performs the relay process. Therefore, the communication efficiency can be increased compared to the conventional wireless relay apparatus (that discards the first frame if an error is detected in it).

No coding gain can be obtained unless the coding method used by the second encoder of the relay apparatus 12 differs from that used by the transmitting apparatus 11. However, the same effect as that obtained when performing coding different from that of the transmitting apparatus 11 can be obtained by applying the same coding as that of the transmitting apparatus 11 via the interleaver 1205*a*. In addition, in this case, the receiving apparatus 13 can use the same decoder when decoding the first frame and when decoding the second frame. This makes it possible to simplify the arrangement of the receiving apparatus.

Also, the relay apparatus 12 includes the error estimation means for calculating the error rate from the received first frame, and notifies the receiving apparatus 13 of the obtained error rate (of the link between the transmitting apparatus 11 and relay apparatus 12) by, e.g., containing the error rate in the second frame. Based on the Slepian-Wolf theory, therefore, even when an erroneous signal is relayed to the receiving apparatus 13, a gain can be obtained by cooperative communication between the transmitting apparatus 11 and relay apparatus 12. The error rate can easily be estimated from the signal-power-to-noise-power ratio or the signal-power-to-noise power plus interference-power ratio, the coding method and modulation method used in the transmitting apparatus, and the number of antennas. Furthermore, when transmitting a signal from the relay apparatus to the receiving apparatus, the receiving apparatus is generally notified of an applied modulation method, coding method, and signal length as a control signal, and it is also possible to notify the receiving apparatus of the error rate in the same manner. As this error rate, it is possible to quantize a real number or logarithm.

The arrangement and receiving process of the receiving apparatus 13 according to this embodiment will be explained below.

Figure 5:
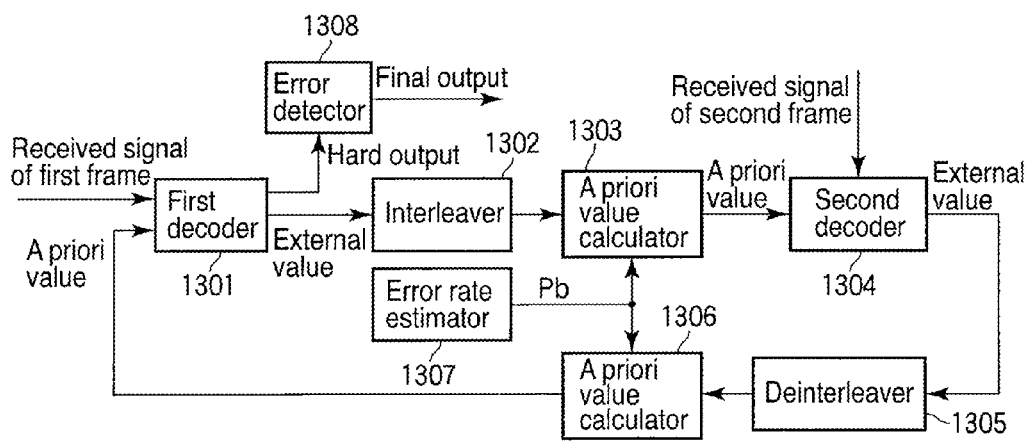
FIG. 5 is a view showing a configuration example of the major parts of a receiving apparatus.
Figure 8:
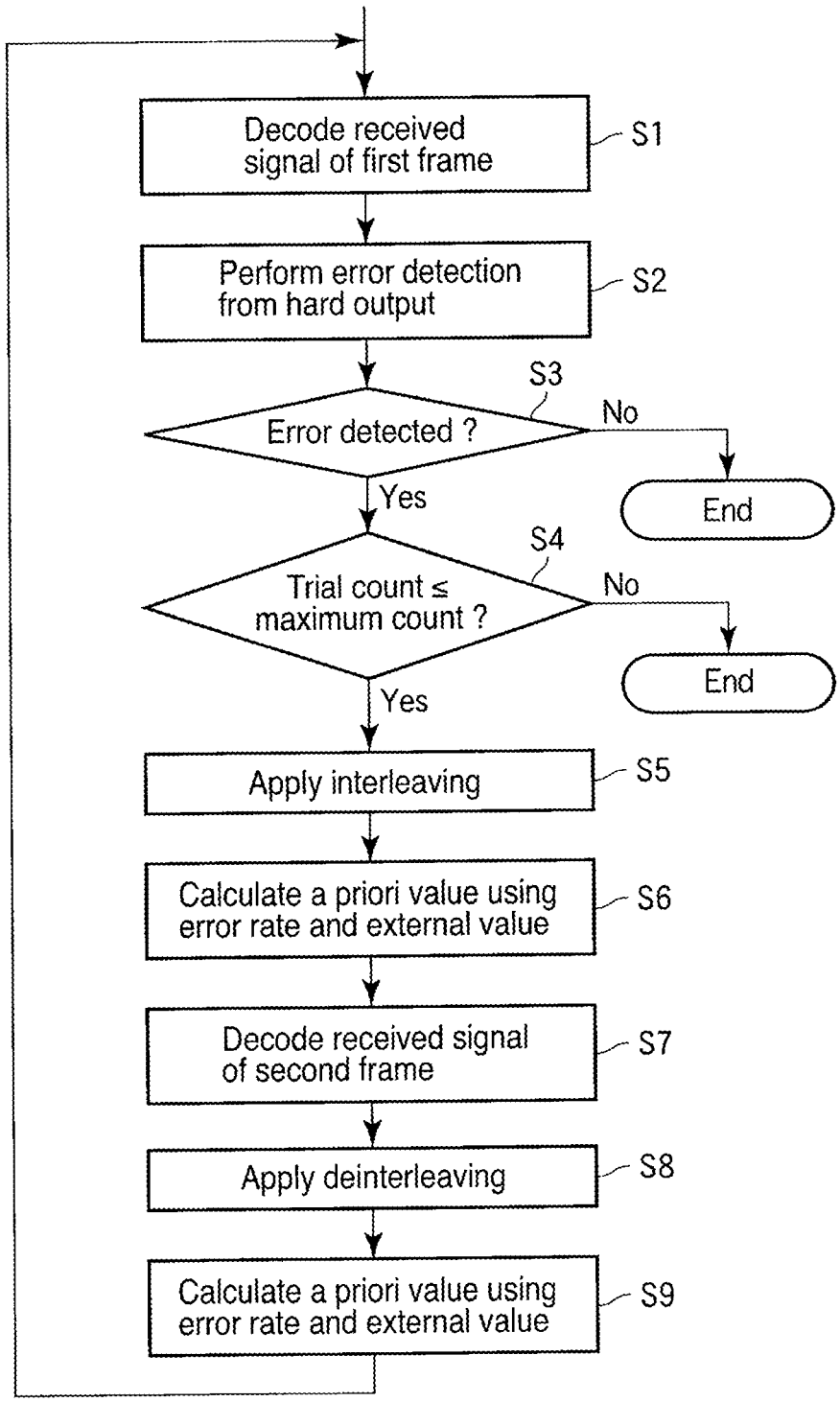
FIG. 8 is a flowchart for explaining a decoding process of the receiving apparatus.

FIG. 5 is a view showing a configuration example of the receiving apparatus 13. FIG. 8 is a flowchart showing the receiving process of the receiving apparatus 13. Note that for the sake of convenience, in the process of receiving the first frame and second frame (loop processing) in the flowchart shown in FIG. 8, decoding (steps S1 to S6) of the first frame is shown before decoding (steps S7 to S9) of the second frame. However, decoding of the second frame is sometimes performed before that of the first frame, and the processing in this case is exactly the same as that shown in FIG. 8.

The receiving apparatus 13 receives the first frame transmitted from the transmitting apparatus 11. At the same time, after that, or before that, the receiving apparatus 13 receives the second frame transmitted from the relay apparatus 12.

A first decoder 1301 decodes the first frame received signal (step S1). A second decoder 1304 decodes the second frame received signal (step S7).

In the following explanation of the receiving process in the receiving apparatus 13, a turbo code is applied as the first error correcting code in (the first encoder 1101 of) the transmitting apparatus 11, the relay apparatus 12 includes the arrangement shown in FIG. 4, the interleaver 1205*a* performs the interleaving process of rearranging the information data extracted from the received first frame, and then the first encoder 1205*b* applies the same turbo code as that of the transmitting apparatus 11.

The first decoder 1301 and the second decoder 1304 (described later) perform MAP decoding on the first error correcting code. The MAP decoding is a decoding method of obtaining a transmission signal sequence that maximizes the transmission probability under the conditions by which a received signal sequence is obtained, and is known as an optimum decoding method. The probability at which a kth data bit $d_k$ is transmitted under the conditions by which the received signal sequence is obtained is called an a posteriori probability. The MAP decoding estimates that a signal sequence that maximizes the a posteriori probability of each transmission bit is a transmitted sequence.

An a posteriori probability log-likelihood ratio obtained by calculating the logarithm of the ratio of the a posteriori probability when $d_k$ is 1 to that when $d_k$ is 0 is called an a posteriori value, and defined by $$L(d_k) = \ln \frac{P(d_k = 1|y)}{P(d_k = 0|y)} \quad (1)$$

where y is a received signal sequence, $P(d_k=1|y)$ is the a posteriori probability at which 1 is transmitted as the kth data bit, and $P(d_k=0|y)$ is the a posteriori probability at which 0 is transmitted as the kth data bit.

Note that the turbo code is generally organized by connecting recursive systematic convolutional codes via an interleaver, so the state of an encoder can be represented using a trellis diagram. Letting $s_k$ be the state of a trellis diagram at time k, the a posteriori value can be represented by $$L(d_k) = \ln \frac{P(d_k = 1|y)}{P(d_k = 0|y)} = \ln \frac{\sum_{d_k=1} P(s_{k-1}, s_k, y)}{\sum_{d_k=0} P(s_{k-1}, s_k, y)} \quad (2)$$

Note that in equation (2) above, the numerator is the sum of the probabilities of all transitions occurring when the kth data bit is 1, among transitions from the state at time k−1 to the state at time k, and the denominator is the sum of the probabilities of all transitions occurring when the data bit is 0.

In equation (2), $P(s_{k-1}, s_k, y)$ is represented by the product of three probabilities as indicated by $$P(s_{k-1}, s_k, y) P(s_{k-1}, y_1^{k-1}) P(s_k, y_k | s_{k-1}) P(y_k^N | s_k) \quad (3)$$

where $y_1^{k-1}$ represents a partial sequence from the first received signal to the (k−1)th received signal of the received signal sequence y, and $y_k$ represents the kth received signal. Also, when $$P(s_{k-1}, y_1^{k-1}) = \alpha(s_{k-1})$$

$$P(s_{k-1}, y_1^{k-1} | s_{k-1}) = \gamma(s_{k-1}, s_k)$$

$$P(y_1^k | s_k) = \beta(s_{k-1})$$

the a posteriori value can be represented by $$L(d_k) = \ln \frac{\sum_{d_k=1} \alpha_{k-1}(s_{k-1})\gamma(s_{k-1}, s_k)\beta_k(s_k)}{\sum_{d_k=0} \alpha_{k-1}(s_{k-1})\gamma(s_{k-1}, s_k)\beta_k(s_k)} \quad (4)$$

Furthermore, $\alpha(s_{k-1})$ and $\beta(s_{k-1})$ can recursively represented by the following equations. Since $\gamma(s_{k-1}, s_k)$ is the probability at which a received signal $y_k$ is obtained when $d_k$ is transmitted, they can be represented by $$\alpha_k(s_k) = \sum_{s_{k-1}} \gamma_k(s_{k-1}, s_k)\alpha_{k-1}(s_{k-1}) \quad (5)$$

$$\beta_{k-1}(s_{k-1}) = \sum_{s_{k-1}} \gamma_k(s_{k-1}, s_k)\beta_k(s_k) \quad (6)$$

$$\gamma_k(s_{k-1}, s_k) = P(y_k | d_k)P(d_k) \quad (7)$$

where $P(d_k)$ represents the probability at which $d_k$ is transmitted as the kth data, and is called an a priori probability, and $P(y_k|d_k)$ can easily be calculated from a received signal, and is called a channel value.

As explained above, the MAP decoding is a method by which an a posteriori value $L(d_k)$ is calculated for all transmission bits, and a transmission signal sequence is estimated by assuming that 1 is transmitted if the sign of $L(d_k)$ is positive and 0 is transmitted if it is negative.

Examples of an algorithm for implementing the MAP decoding are the BCJR algorithm, Log-MAP algorithm, and Max-Log-MAP algorithm, but any method can be used in the embodiment.

The first decoder 1301 shown in FIG. 5 applies the MAP decoding (step S1). Based on the a posteriori value $L(d_k)$, the first decoder 1301 outputs a transmission signal sequence found to be 1 or 0 by hard decision to an error detector 1308 (hard output), and outputs an external value $L_e(d_k)$ (step S2).

The error detector 1308 performs error detection using the hard output, and terminates the decoding (of the first frame) if no error is detected (step S3). If an error is detected and a decoding trial count is less than or equal to a predetermined maximum count (step S4), the process advances to step S5. If the trial count exceeds the maximum count, the decoding is terminated.

Note that the external value is obtained by subtracting the a priori value and channel value from the a posteriori value, and can be represented by $$L_e(d_k) = L(d_k) - \ln \frac{\sum_{d_k=1} \gamma(s_{k-1}, s_k)}{\sum_{d_k=0} \gamma(s_{k-1}, s_k)} \quad (8)$$

The external value $L_e(d_k)$ output from the first decoder 1301 is input to an interleaver 1302 where an interleaving process of rearranging data of the external value is performed (step S5). The interleaving process herein applied performs the same rearrangement as that of the interleaving process applied by the relay apparatus 12. That is, the interleaver 1205a of the relay apparatus 12 and the interleaver 1302 of the receiving apparatus 13 must perform rearrangement in a predetermined order. Consequently, the order of the external value output from the interleaver 1302 matches that of the data bits transmitted by the relay apparatus 12. Accordingly, when receiving the second frame transmitted by the relay apparatus 12 and decoding the second frame, the receiving apparatus 13 can use the output from the interleaver 1302 as an a priori value.

In the second encoder 1205 of the relay apparatus 12, however, information data different from the information data transmitted by the transmitting apparatus 11 may have undergone error correcting coding due to an error occurring in the link between the transmitting apparatus 11 and relay apparatus 12. On the other hand, the two signals, i.e., the first and second frames received by the receiving apparatus 13 are originally the same information data transmitted from the same transmitting apparatus 11. Therefore, the correlation between these two signals is extremely high even if an error occurs in the link between the transmitting apparatus 11 and relay apparatus 12. Since the correlation value depends on the error rate between the transmitting apparatus 11 and relay apparatus 12, decoding using the correlation value can be implemented using the error rate.

An a priori value calculator 1303 shown in FIG. 5 corrects the external value $L_e(d_k)$ output from the interleaver 1302 using the error rate between the transmitting apparatus 11 and relay apparatus 12, which is obtained from an error rate estimator 1307, and calculates an a priori value to be used when decoding the second frame (step S6).

Since the error rate depends on the communication quality between the transmitting apparatus 11 and relay apparatus 12 as described previously, the error rate can be estimated from the error rate or communication quality transmitted from the relay apparatus 12. When receiving the error rate transmitted from the relay apparatus 12, the receiving apparatus 13 stores the received error rate in the error rate estimator 1307. The receiving apparatus 13 then outputs the stored error rate to the a priori value calculator 1303 and an a priori value calculator 1306 (described later). When the relay apparatus 12 transmits not the error rate itself but a communication quality value, the error rate estimator 1307 calculates the error rate based on the communication quality value, and outputs the calculated error rate to the a priori value calculator 1303 and the a priori value calculator 1306 (described later).

Next, a method by which the a priori value calculator 1303 calculates the a priori value using this error rate will be explained below.

From the external value $L_e(d_k)$ output from the first decoder 1301 shown in FIG. 5, a probability $P_1(d_k=1)$ at which 1 is transmitted as the kth signal and a probability $P_1(d_k=0)$ at which 0 is transmitted can respectively be represented by $$P_1(d_k = 1) = \frac{e^{L_e(d_k)}}{1 + e^{L_e(d_k)}} \quad (9)$$

$$P_1(d_k = 0) = \frac{1}{1 + e^{L_e(d_k)}} \quad (10)$$

On the other hand, a probability $P_2(d_k=1)$ at which the relay apparatus 12 transmits 1 in response to this signal has two cases: the transmitting apparatus 11 transmits 1 and the relay apparatus 12 correctly determines that the signal is 1; and 0 is transmitted but erroneously regarded as 1. The probability $P_2(d_k=1)$ can be represented using the error rate $P_b$ in the relay apparatus 12 by $$P_2(d_k=1) = (1-P_b) \cdot P_1(d_k=1) + P_b \cdot P_1(d_k=0) \quad (11)$$

Similarly, a probability $P_2(d_k=2)$ at which the relay apparatus 12 transmits 0 can be represented by $$P_2(d_k=0)=P_b\cdot P_1(d_k=1)+(1-P_b)\cdot P_1(d_k=0) \quad (12)$$

Accordingly, the external value $L_e(d_k)$ corrected as indicated by equation (13) can be obtained by replacing the left hand side ($P_1(d_k=1)$) of equation (9) with the right hand side of equation (11), replacing the left hand side ($P_1(d_k=0)$) of equation (10) with the right hand side of equation (12), and solving these equations for $L_e(d_k)$. The obtained corrected external value $L_e(d_k)$ is used as an a priori value $L_a(d_k)$ for use in the MAP decoding of the second decoder 1304. That is, the a priori value calculator 1303 shown in FIG. 5 calculates the a priori value $L_a(d_k)$ by $$L_d(d_k) = \ln\frac{(1-P_b)\cdot P_1(d_k=1)+P_b\cdot P_1(d_k=0)}{P_b\cdot P_1(d_k=1)+(1-P_b)\cdot P_1(d_k=0)} \quad (13)$$

When the a priori value calculator 1303 of the receiving apparatus 13 calculates the a priori value from the error rate and external value as indicated by equation (13), the second decoder 1304 decodes the second frame received signal using this a priori value (step S7).

Like the first decoder 1301 performs MAP decoding on the first frame, the second decoder 1304 applies MAP decoding to the second frame received signal, and outputs the external value calculated by equation (8).

As described earlier, the relay apparatus 12 performs the interleaving process on the extracted information data signal sequence. Therefore, a deinterleaver 1305 performs a deinterleaving process on the external value output from the second decoder 1304, thereby obtaining an external value rearranged into the signal sequence transmitted by the transmitting apparatus 11 (step S8).

This external value having undergone the deinterleaving process by which the deinterleaver 1305 returns the rearranged data to the original arrangement is an external value corresponding to the data bits reproduced by the relay apparatus 12. The probability at which the relay apparatus 12 has transmitted 1 and the probability at which the relay apparatus 12 has transmitted 0 can respectively be represented by $$P_2(d_k=1) = \frac{e^{L_e(d_k)}}{1+e^{L_e(d_k)}} \quad (14)$$

$$P_2(d_k=0) = \frac{1}{1+e^{L_e(d_k)}} \quad (15)$$

The probability of the signal transmitted by the transmitting apparatus 11 can be represented by equations (11) and (12) using an error rate $P_b$ in the relay apparatus 12. Therefore, equation (16) below is obtained by respectively replacing the left hand sides of equations (11) and (12) with the right hand sides of equations (14) and (15). From equation (16), the corrected external value, i.e., the a priori value to be used in the first decoder 1301 is calculated. That is, the a priori value calculator 1306 calculates the a priori value $L_a(d_k)$ from equation (16) using the above-mentioned error rate output from the error rate estimator 1307, and the external value (obtained by decoding the second frame) output from the deinterleaver 1305 (step S9).

$$L_a(d_k) = \ln\frac{(1-P_b)\cdot P_2(d_k=1)+P_b\cdot P_2(d_k=0)}{P_b\cdot P_2(d_k=1)+(1-P_b)\cdot P_2(d_k=0)} \quad (16)$$

The first decoder 1301 decodes the first frame received signal again using the a priori value calculated by the a priori value calculator 1306. That is, even when the relay apparatus 12 relays an erroneous signal, a correct signal can be decoded by forming a turbo loop by weighting the likelihood of the signal transmitted by the transmitting apparatus 11 and the signal relayed by the relay apparatus 12 by the error rate.

As described above, no a priori value is conventionally obtained when decoding is performed for the first time. In this embodiment, however, the external value obtained by decoding the second frame can be used as the a priori value (after being corrected using the error rate between the transmitting apparatus 11 and relay apparatus 12). This can make the decoding accuracy higher than the conventional value.

The decoding accuracy of the first frame can gradually be increased by repeating the above process a plurality of times. That is, the process returns to step S1, and the first decoder 1301 outputs, to the error detector 1308, the hard output obtained by decoding the first frame using the a priori value calculated (from the external value obtained by decoding the second frame and the error rate) by the a priori value calculator 1306 (steps S1 and S2). The error detector 1308 performs error determination using the hard output (step S3), and terminates the decoding if no error is detected. If an error is detected again, the process advances to step S4. If the decoding trial count is less than or equal to the predetermined maximum count (step S4), the process advances to step S5. If the trial count exceeds the maximum count, the decoding is terminated.

In this embodiment as described above, a frame in which an error is detected by the relay apparatus 12 need not be discarded but can be reused in the receiving apparatus 13. This makes efficient transmission feasible. The receiving apparatus 13 repetitively performs decoding using data of the correlation between the first frame transmitted from the transmitting apparatus 11 and the second frame transmitted from the relay apparatus 12. According to the Slepian-Wolf theorem, therefore, if the sum of the rates of the two frames is higher than the joint entropy, the receiving apparatus 13 can reproduce data without any distortion. This means that the rate of the error correcting code used in each link can be increased as long as the above condition is met. That is, this makes efficient transmission possible without any unnecessary redundancy.

Figure 6:
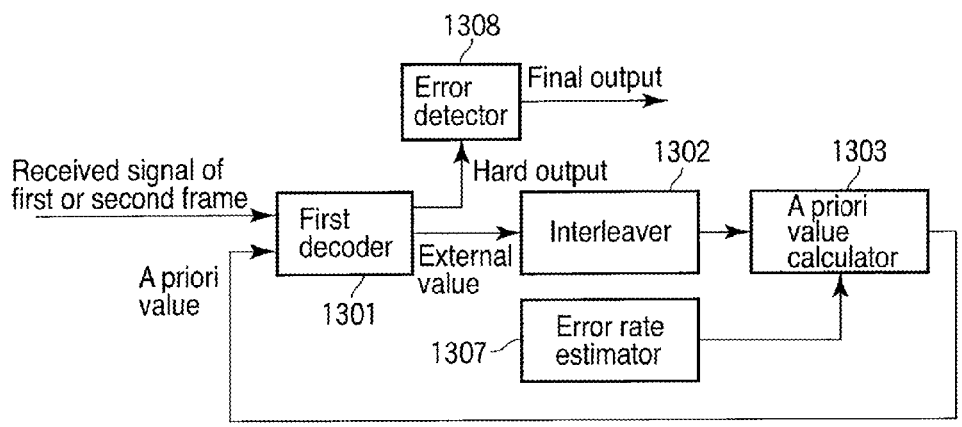
FIG. 6 is a view showing another configuration example of the major parts of the receiving apparatus.

Note that in FIG. 5, decoding is performed using a plurality of decoders, i.e., the first decoder 1301 and second decoder 1304. However, when the relay apparatus 12 applies the same coding as that of the transmitting apparatus 11, the same decoder 1301 can be used for decoding of both the first and second frames in the receiving apparatus 13 as shown in FIG. 6. This makes it possible to simplify the arrangement.

When rearranging the external value output when the first decoder 1301 decodes the first frame, however, the interleaver 1302 shown in FIG. 6 performs rearrangement corresponding to interleaving performed by the interleaver 1302 shown in FIG. 5. When rearranging the external value output when the first decoder 1301 decodes the second frame, the interleaver 1302 shown in FIG. 6 performs rearrangement corresponding to deinterleaving performed by the deinterleaver 1305 shown in FIG. 5.

Figure 7:
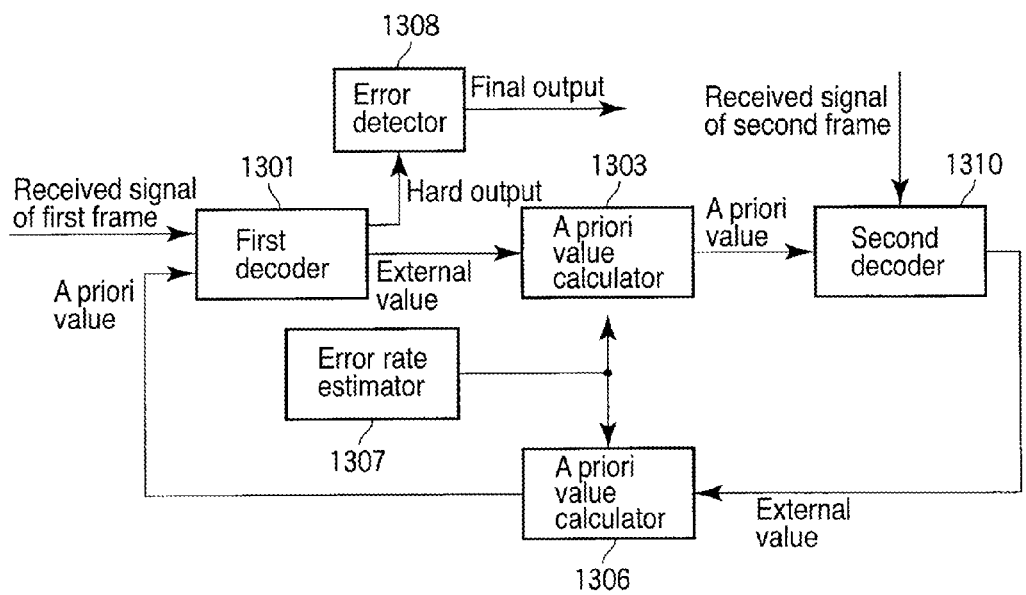
FIG. 7 is a view showing still another configuration example of the major parts of the receiving apparatus.

Also, when the relay apparatus 12 applies a code different from that of the transmitting apparatus 11, i.e., when the relay apparatus 12 includes the configuration shown in FIG. 3, it is not always necessary to apply interleaving. Accordingly, the receiving apparatus 13 when the relay apparatus 12 does not perform any interleaving has a configuration as shown in FIG. 7. Note that in FIG. 7, the same reference numerals as in FIG. 5 denote the same parts. FIG. 7 differs from FIG. 5 in that the interleaver 1302 and deinterleaver 1305 are omitted, and a second decoder 1310 for performing coding performed by the relay apparatus 12 (i.e., performing second error correcting coding performed by the second encoder 1204 shown in FIG. 3) when decoding the second frame is added instead of the second decoder 1304.

MAP decoding performed for the second error correcting code by the second decoder 1310 is basically the same as that of the above-described second decoder 1304. That is, the second frame is decoded using the a priori value calculated (from the external value obtained when decoding the first frame and the error rate) by the a priori value calculator 1303, and an external value is output. The a priori value calculator 1306 corrects this external value using the above-mentioned error rate. The first decoder 1301 uses the corrected value as an a priori value when decoding the first frame.

In this embodiment as described above, it is possible to perform relay even when an error occurs in the relay apparatus 12, thereby implementing high-efficiency wireless relay.

Second Embodiment

The second embodiment will be explained below. The second embodiment is the same as the first embodiment in that even when an error is detected in a first frame received by a relay apparatus 12, the signal is re-encoded and relayed. The second embodiment differs from the first embodiment in that the relay apparatus 12 applies decoding when extracting data transmitted from a transmitting apparatus 11, the error rate in the relay apparatus 12 or a receiving apparatus 13 is calculated by a different method, and an a priori value calculator calculates an a priori value by a different method.

When a systematic code is applied as an error correcting code, information data can be extracted without applying any decoding as disclosed in the first embodiment. On the other hand, when using a non-systematic code, information data cannot be extracted without decoding. Therefore, decoding must be applied.

Figure 9:
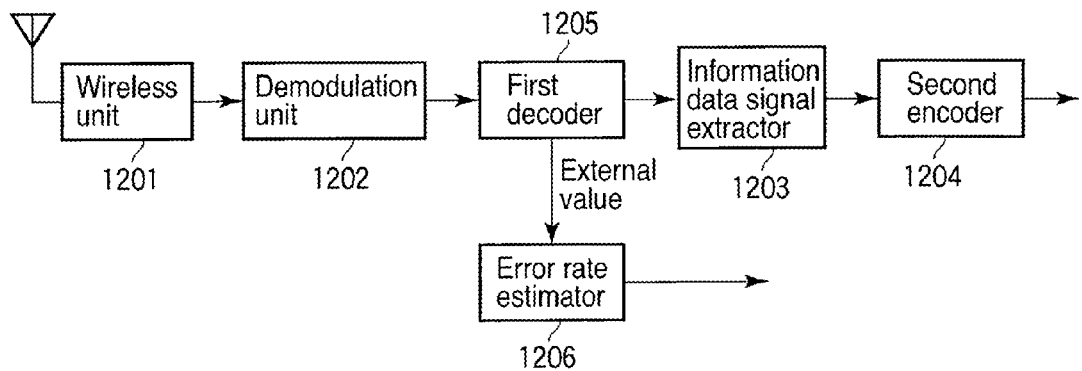
FIG. 9 is a view showing still another configuration example of the major components of the relay apparatus.

FIG. 9 shows a configuration example of the major components of the relay apparatus 12 according to the second embodiment. The same reference numerals as in FIG. 3 denote the same parts in FIG. 9. In this configuration shown in FIG. 9, a first decoder 1205 for performing decoding corresponding to encoding performed by a first encoder 1101 of the transmitting apparatus 11 and an error estimator 1206 for calculating the error rate using an external value output from the first decoder 1205 are added between a demodulator 1202 and information data signal extractor 1203.

Similar to the first decoder 1301 shown in, e.g., FIG. 5, the first decoder 1205 performs MAP decoding corresponding to a first error correcting code applied by the first encoder 1101 of the transmitting apparatus 11. Note that as explained in the first embodiment, the first encoder 1205 outputs an external value as a result of the MAP decoding.

After the first decoder 1205 decodes a first frame received signal, as explained in the first embodiment, the information data signal extractor 1203 extracts information data, and a second encoder 1204 re-encodes the information data (generates a second frame), and relays the data.

If an error remains when the first decoder 1205 performs decoding, the generated error presumably becomes a burst error. The burst error can be modeled as a two-state Markov data source. The burst properties such as the burst length distribution can be modeled by the state transition probability of the Markov data source. Furthermore, the value of the state transition probability depends on the quality of a link between the transmitting apparatus 11 and relay apparatus 12. Therefore, the reality is not lost even when assuming that the state transition probability value is known.

Accordingly, the error rate estimator 1206 shown in FIG. 9 calculates the error rate generated in the link between the transmitting apparatus 11 and relay apparatus 12 using the external value output from the first decoder 1205 and the above-mentioned known state transition probability value.

Figure 10:
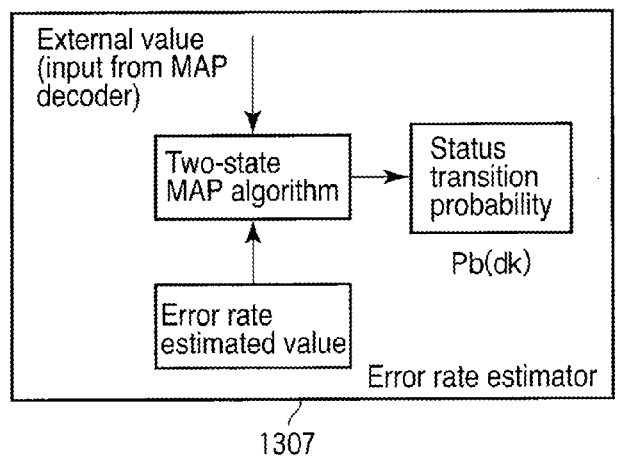
FIG. 10 is a view showing a configuration example of an error rate estimator.

FIG. 10 shows a configuration example of the error rate estimator 1206. The error rate estimated value is obtained by executing a MAP algorithm on a trellis diagram corresponding to the two-state Markov data source. This method is known as the Baum-Welch algorithm, and details of the method are described in "L. R. Rabiner, 'A tutorial on hidden Markov models and selected applications on speech recognition,' Proc. IEEE, vol. 77, pp. 257-285, February 1989." The value of the state transition probability of the two-state Markov data source that generates a burst error and an external value obtained by performing the MAP algorithm on the error correcting code are input to the MAP algorithm, and the MAP algorithm outputs the error rate estimated value.

The error rate calculated by the error rate estimator 1206 is, e.g., modulated and converted into an analog signal together with or separately from the generated second frame, and the analog signal is transmitted (as it is contained in, e.g., the second frame) to the receiving apparatus 13.

Note that the information data bit error rate calculated as described above changes from one bit to another. Therefore, the receiving apparatus 13 having received this error rate calculates an a priori value in accordance with equation (13) or (16) in a priori value calculators 1306 and 1303 shown in FIG. 5 using an error rate $P_b(d_k)$ that changes from one bit to another.

The rest of the processing in the receiving apparatus 13 is the same as that of the first embodiment, so a repetitive explanation will be omitted.

When the relay apparatus 12 performs decoding, a burst error occurs, so the error rate characteristic is not uniform for each bit but is deviated. A turbo loop having higher accuracy is formed by reflecting the error rate of each bit as a correlation value on the external value (to be used as an a priori value in decoding).

Also, an error rate estimator 1307 shown in FIG. 10 preferably calculates the error rate in the relay apparatus 12 as shown in FIG. 9, but the embodiment is not limited to this. For example, it is also possible to use the error rate estimator 1307 shown in FIG. 10 instead of the error rate estimator 1307 of the receiving apparatus 13 shown in FIG. 7, and calculate the error rate in the receiving apparatus 13. In this case, the error rate is calculated using the external value output when the second decoder 1310 decodes the second frame in the receiving apparatus 13, and the above-mentioned known state transition probability value.

Alternatively, the error rate estimator 1307 shown in FIGS. 5 to 7 explained in the first embodiment can calculate the error rate by the same method as that of the error rate estimator 1307 shown in FIG. 10 using the external value output when decoding the second frame and the above-mentioned known state transition probability value.

In the first and second embodiments as explained above, even when an error is detected from the first frame received by the relay apparatus 12, the signal can be relayed, so a high-efficiency wireless relay system can be implemented. Also, even when a burst error occurs in the relay apparatus 12 and the error rate changes from one bit to another, the receiving apparatus 13 can achieve high-accuracy decoding. This makes it possible to implement a high-efficiency wireless relay system.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless apparatus comprising:
   a first decoder to perform a first decoding process of calculating a first a posteriori value using a first a priori value and a first frame transmitted from a first apparatus, and output a hard decision value of the first a posteriori value and a first external value;
   a second decoder to perform a second decoding process of calculating a second a posteriori value using a second a priori value and a second frame transmitted from a second apparatus, and output a hard decision value of the second a posteriori value and a second external value, the second apparatus having received the first frame, the second frame containing re-encoded data of the first frame containing an error;
   an error rate estimator to estimate an error rate of one of the first frame or the second frame;
   a first a priori value calculator to calculate the second a priori value by correcting the first external value based on the error rate; and
   a second a priori value calculator to calculate the first a priori value by correcting the second external value based on the error rate.

2. The apparatus according to claim 1, further comprising an interleaver to perform a first interleaving process on the first external value,
   wherein the first a priori value calculator calculates the second a priori value by correcting the first external value having undergone the first interleaving process, based on the error rate of one of the first frame or the second frame,
   further comprising a deinterleaver to perform, on the second external value, a deinterleaving process of performing rearrangement in an order opposite to that of the first interleaving process, and
   wherein the second a priori value calculator calculates the first a priori value by correcting the second external value having undergone the deinterleaving process, based on the error rate.

3. The apparatus according to claim 2, wherein the second frame has undergone a second interleaving process of performing the same rearrangement as that of the first interleaving process.

4. The apparatus according to claim 1, wherein the error rate estimator estimates the error rate which changes from one bit to another using the second external value.

5. The apparatus according to claim 1, wherein the error rate is an error rate of the first frame notified from the second apparatus.

6. The apparatus according to claim 1, further comprising an antenna.

7. The apparatus according to claim 1, wherein the error estimator estimates the error rate from a communication quality transmitted from the first apparatus.

8. A method of a wireless apparatus comprising:
   performing a first decoding process of calculating a first a posteriori value using a first a priori value and a first a first frame transmitted from a first apparatus, and outputting a hard decision value of the first a posteriori value and a first external value;
   performing a second decoding process of calculating a second a posteriori value using a second a priori value and a second frame transmitted from a second apparatus, and outputting a hard decision value of the second a posteriori value and a second external value, the second apparatus having received the first frame, the second frame containing re-encoded data of the first frame containing an error;
   estimating an error rate of one of the first frame or the second frame;
   calculating the second a priori value by correcting the first external value based on the error rate; and
   calculating the first a priori value by correcting the second external value based on the error rate.

9. The method according to claim 8, further comprising performing a first interleaving process on the first external value,
   wherein the calculating the second a priori value calculates the second a priori value by correcting the first external value having undergone the first interleaving process, based on the error rate of one of the first frame or the second frame,
   further comprising performing, on the second external value, a deinterleaving process of performing rearrangement in an order opposite to that of the first interleaving process, and
   wherein the calculating the first a priori value calculates the first a priori value by correcting the second external value having undergone the deinterleaving process, based on the error rate.

10. The method according to claim 9, wherein the second frame has undergone a second interleaving process of performing the same rearrangement as that of the first interleaving process.

11. The method according to claim 8, further comprising estimating the error rate which changes from one bit to another using the second external value.

12. The method according to claim 8, wherein the error rate is an error rate of the first frame notified from the second apparatus.

13. The apparatus according to claim 8, wherein the step of estimating the error rate comprises estimating the error rate from a communication quality transmitted from the first apparatus.

* * * * *